United States Patent [19]
Gambino et al.

[11] Patent Number: 5,960,315
[45] Date of Patent: Sep. 28, 1999

[54] TAPERED VIA USING SIDEWALL SPACER REFLOW

[75] Inventors: Jeffrey P. Gambino, Gaylordsville, Conn.; Carl J. Radens, Poughkeepsie, N.Y.

[73] Assignee: International Business Machines Corporation, Armonk, N.Y.

[21] Appl. No.: 08/889,993

[22] Filed: Jul. 10, 1997

[51] Int. Cl.⁶ .................... H01L 21/4763; H01L 21/461
[52] U.S. Cl. .................. 438/632; 438/696; 438/648; 438/688; 438/908
[58] Field of Search ................................. 438/632, 646, 438/648, 688, 908, 913

[56] References Cited

U.S. PATENT DOCUMENTS

| | | |
|---|---|---|
| 4,755,479 | 7/1988 | Miura . |
| 4,948,743 | 8/1990 | Ozaki . |
| 5,117,273 | 5/1992 | Stark et al. . |
| 5,175,122 | 12/1992 | Wang et al. . |
| 5,234,852 | 8/1993 | Liou . |
| 5,308,929 | 5/1994 | Tani et al. . |
| 5,716,869 | 2/1998 | Hibino et al. .............. 437/188 |
| 5,843,842 | 12/1998 | Lee et al. ................ 438/688 |

FOREIGN PATENT DOCUMENTS

| | | |
|---|---|---|
| 3-161926 | 7/1991 | Japan . |
| 4-162719 | 6/1992 | Japan . |
| 5-206111 | 8/1993 | Japan . |
| 6-69153 | 3/1994 | Japan . |

*Primary Examiner*—John F. Niebling
*Assistant Examiner*—Michael S. Lebentritt
*Attorney, Agent, or Firm*—Whitham, Curtis & Whitham; Alison Mortinger

[57] ABSTRACT

A method of forming a tapered via includes steps of forming a via, coating the walls and bottom of the via with a reflow material, removing the reflow material from the bottom the via and causing the reflow material to become non-solid. Surface tension and other liquid forces cause the reflow material to form a tapered shape (i.e., be thicker at the bottom than the top). Therefore, with the invention, there is more control over the reflow process.

13 Claims, 3 Drawing Sheets

TAPERED VIA USING SIDEWALL SPACER REFLOW

BACKGROUND OF THE INVENTION

1. Field of the Invention

The present invention generally relates to structures formed with reflow materials and more particularly to tapered vias formed with reflow materials.

2. Description of the Related Art

Materials which change from a solid state to a semi-liquid or liquid state at a temperature lower than the phase transition point of a semiconductor are referred to as reflow materials and are used by the microelectronics industry for various applications. Various types of glasses or insulators, such as borophosphosilicate glass (BPSG) or boron doped glass (BSG) are commonly used as reflow materials.

An advantage of using reflow materials is that, because of their low melting temperature, the reflow materials can be heated to a liquid or semi-liquid state, which allows the reflow material to flow (i.e. become smooth or fill a void), without affecting the underlying substrate.

However, the control of reflow materials in very small structures and the relatively high dielectric constant of these materials, has limited their application in the manufacturing of very-large-scale advanced integrated circuits.

When forming vias (i.e., holes allowing electrical connection between different layers) in a substrate, it is desirable to open the vias through the inter-level dielectric (ILD) to selected local regions of the under layer conductor. Further, it is conventionally known to be advantageous to taper the sidewall angle of the vias so that the subsequent deposition of the conducting material will completely fill the contact hole and not leave voids or locally thin regions in the conductor.

Tapered-via contacts should preferably provide high yield, low cost, ground-rule scaling (i.e., be useable with very small structures) and a controllable contact resistance. Taper angles in the range of 60 deg–85 deg from the horizontal plane have been found to permit void-free deposition (i.e., filling) of conductor films in contact holes.

As mentioned above, it is desirable to maintain a low dielectric constant in the ILD and to reduce the capacitance between adjacent conductive patterns, and hence reduce the resistance-capacitance (RC) propagation delay associated with the circuit.

Conventionally, reflow materials were not used as tapered spacers in vias because controlling the reflow (i.e., the melting) of the reflow material is difficult an expensive, particularly with very small structures such as vias. Secondly, reflow materials conventionally have and undesirably high dielectric constant. These shortcomings limit the application of these materials in the manufacturing of very-large-scale advanced integrated circuits.

Further, blanket reflow materials are difficult to integrate with global planarization such as chemical-mechanical polishing (CMP). Blanket reflow materials also present depth-of-focus limitations when used in multi-layer interconnections.

SUMMARY OF THE INVENTION

It is, therefore, an object of the present invention to provide a structure and method for forming vias with tapered spacers comprising a reflow material. More specifically, the invention is a method for fabrication of a tapered via using the reflow of a material formed as a sidewall spacer within the contact via.

The method includes steps of forming a via, coating the walls and bottom of the via with a reflow material, removing the reflow material from the bottom of the via and causing the reflow material to become liquid. Surface tension causes the reflow material to form a tapered shape (i.e., be thicker at the bottom than the top). Therefore, with the invention, no etching is required to shape the reflow spacer into a tapered shape.

The inventive reflow spacer method uses materials with relatively low reflow temperatures for tapered via formation, while maintaining standard (silicon dioxide) or low dielectric constant materials for the bulk ILD.

Therefore, with the invention, the control of the reflow material is increased because of the smaller volume of the reflow material utilized. Also, any additional etching steps are cleaner because of the reduced amount of reflow material used. Since the reflow material is removed from the field region, the dielectric constant of the bulk ILD in the field region may be kept low. Further, with the invention, since the spacers are formed in a conformal and thin (relative to the contact diameter) film, the minimum image size can be reduced substantially.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
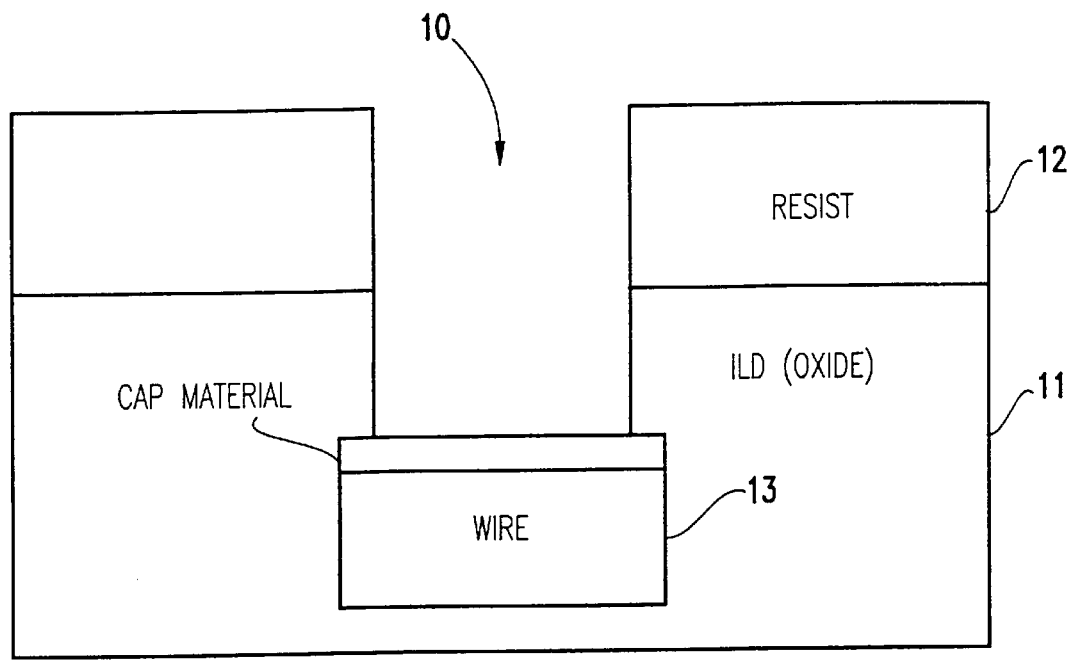
FIG. 1 is a schematic illustration of a via according to the invention.
Figure 2:
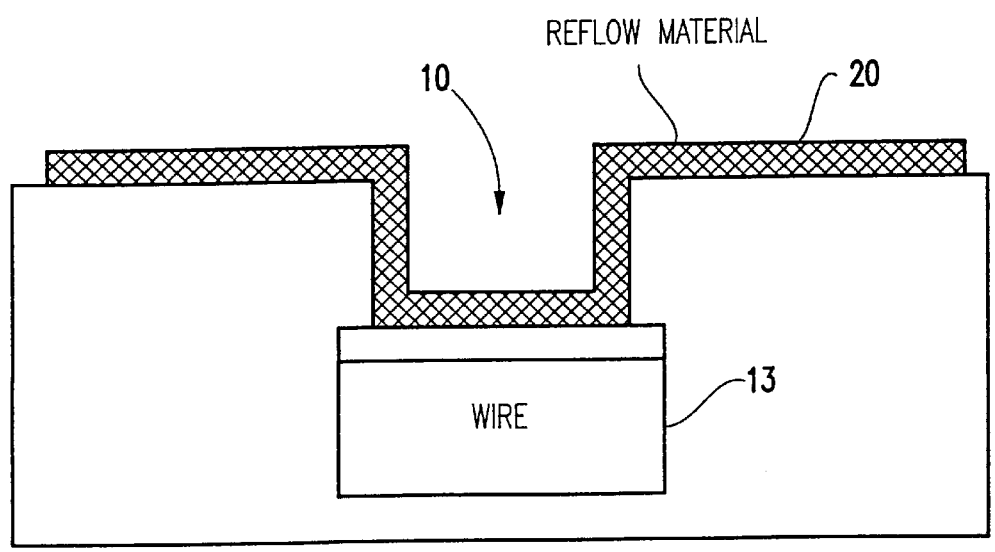
FIG. 2 is a schematic illustration of the via in FIG. 1 coated with a reflow material according to the invention.

The figures attached hereto illustrate the inventive method of fabrication of tapered sidewall spacers within a via using a reflow material. Referring to FIG. 1, a contact hole 10 (i.e., via) is formed in an inter-level dielectric (ILD) 11 (silicon dioxide or polymer material) using conventional processing such as photoresist-masked reactive-ion etching (RIE) of the ILD 11.

A photoresist 12 is preferably patterned using conventional optical lithography. Such conventional optical lithography could include, for example, a thin film (0.5–2 um) of photosensitive polymer 12 coated onto the ILD 11, and exposed to optical radiation having a power (i.e., 10–100 mJ) sufficient to induce a photochemical reaction in selected regions of the chip 10. The selected regions 10 are illuminated through a photo-mask (not illustrated) such as chrome on quartz. The photo-mask includes a pattern of clear holes in the case of positive-tone lithography.

After exposure and development of the photoresist, the pattern of holes 10 in the resist is translated into the ILD oxide 11 using an anisotropic dry etch process such as reactive ion etching (RIE). Perflorocarbon process gases such as CF4, CHF3, and CxFy (x and y selected such that a balance between carbon and fluorine provides anisotropic, and particle-free conditions) may be used for the dry etch, for example. Either a cathode-coupled dry etch tool (i.e., r.f. power on wafer electrode), or inductively coupled dry etch reactors may be used to pattern the ILD 11.

For example, in the case of a 200 mm diameter silicon wafer substrate, an anisotropic dry etch process may use 10–100 sccm CF4, 10–100 sccm CHF3, a cathode power of 500–1000 W at 13.6 MHZ, and a pressure of 50–150 mT to create the opening 10 in the ILD 11.

The ILD material 11 is deposited over a previously patterned conducting layer (wire level) 13. The ILD 11, such as silicon dioxide, should have a uniform thickness (+/−5%), and be free of defects. It is preferable to have a low dielectric constant in the ILD 11 to reduce the capacitance between adjacent conductive patterns, and hence reduce the RC propagation delay associated with the circuit.

After the dry etch, the photoresist material is stripped in, for example, an oxygen-rich environment, such as a dry ash tool, and wet cleaned to remove any post-etch residue. The reflow material 20 is deposited in a thin layer over the contact via 10. The thickness of the reflow material is selected to coat the contact shape, and not fill the volume of the contact via 10. A thickness of less than 30% of the diameter of the contact via 10 is preferable.

Figure 3:
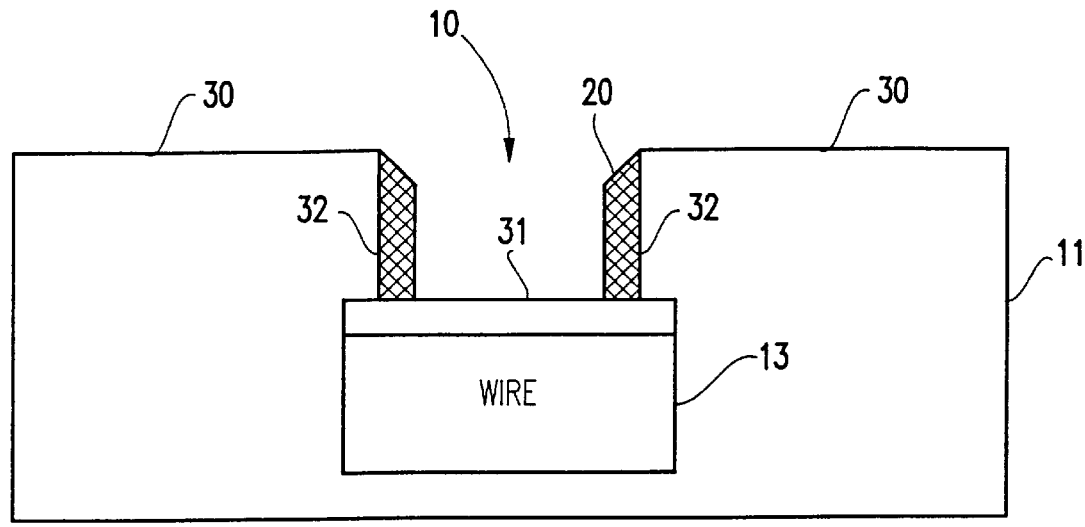
FIG. 3 is a schematic illustration of the reflow material being removed from all but the sidewalls of the via illustrated in FIG. 1, according to the invention.

As shown in FIG. 3, the reflow material 20 is then etched in an anisotropic reactive ion etch (RIE) process. During the RIE process, the reflow material 20 is removed only from the horizontal (planar) regions 30, 31. The reflow spacer material is thereby cleared (partially or totally) from the bottom of the contact hole 31.

Preferably, the reflow material is left in place only along the vertical sidewalls 32 of the contact hole 10, as shown in FIG. 3. Alternatively if a conductive material such as Aluminum is used as the reflow spacer, the reflow material may be selectively etched to underlayer a conductor such as Tungsten.

Figure 4:
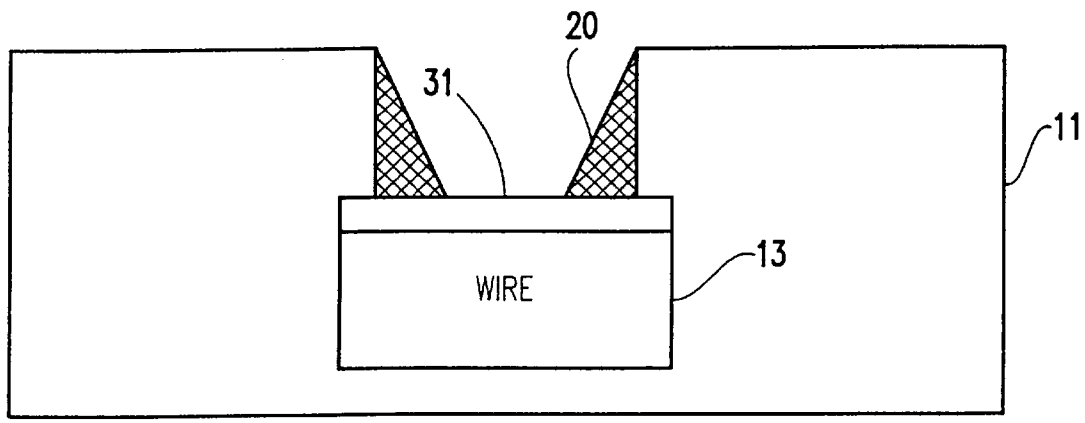
FIG. 4 is a schematic illustration of the reflow material being heated or annealed to form tapered spacers according to the invention.

The resulting sidewall spacer material 20 is heated to its glass transition temperature (Tg) so that, because of surface tension or other similar forces, the walls 20 take on a tapered shape, as shown in FIG. 4. As shown in FIG. 4, at Tg, the sidewall spacer material reflows within the contact, and a tapered profile is formed for subsequent (void-free) metal deposition and patterning. It is preferable to reflow the spacer material 20 inside the contact 10 to provide a tapered surface for the subsequent deposition of a conductor material without closing off the bottom of the contact 31.

Anneals may be used to reflow a variety of dielectric materials including doped glasses. In the case of doped glasses such as BPSG, the reflow is controlled by the temperature and duration of an anneal.

The taper angle, and profile of the reflow spacer is selected using (in the case of a doped oxide) the initial spacer thickness, material composition (i.e., glass transition temperature (Tg)), spacer over-etch, reflow anneal temperature and anneal time. For example if a steep angle was desired, the spacer should be thick, should have a low transition temperature and the anneal time should be extended. A low glass transition temperature will result in relatively more taper due to the reduced viscosity of the material during the anneal.

A reflow temperature that is below the temperature at which undesirable material transitions take place in the other structures in the semiconductor is required to maintain the integrity of the patterned under-layer conductive films (wires), and prevent extrusions of metal and to maintain other semiconducting properties of the device. Such undesirable material transitions include, for example, phase transitions (i.e., solid to liquid), extrusion, thermal stress and morphology. Therefore, the reflow material is selected such that its transition temperature is below that temperature at which damage (extrusions) occur to the under-layer materials. Various additions to phosphosilicate glass materials such as oxides of boron, germanium and arsenic are known to modify the glass transition temperature Tg of phosphosilicate glass.

See for example: K. Nassau, et al., "Modified Phosphosilicate Glasses for VLSI Applications," Journal of the Electrochemical Society, V132, n2, pg 409. Nassau et al. found that at 8 mole (m/o) percent P2O5, the Tg could be varied from 610 C (17 m/o B2O3), 420 C (43 m/o B2O3), to 310 C (60 m/o B2O3). The lower Tg 310–420 C would be compatible with under-layer Al wire interconnect processing.

Figure 5:
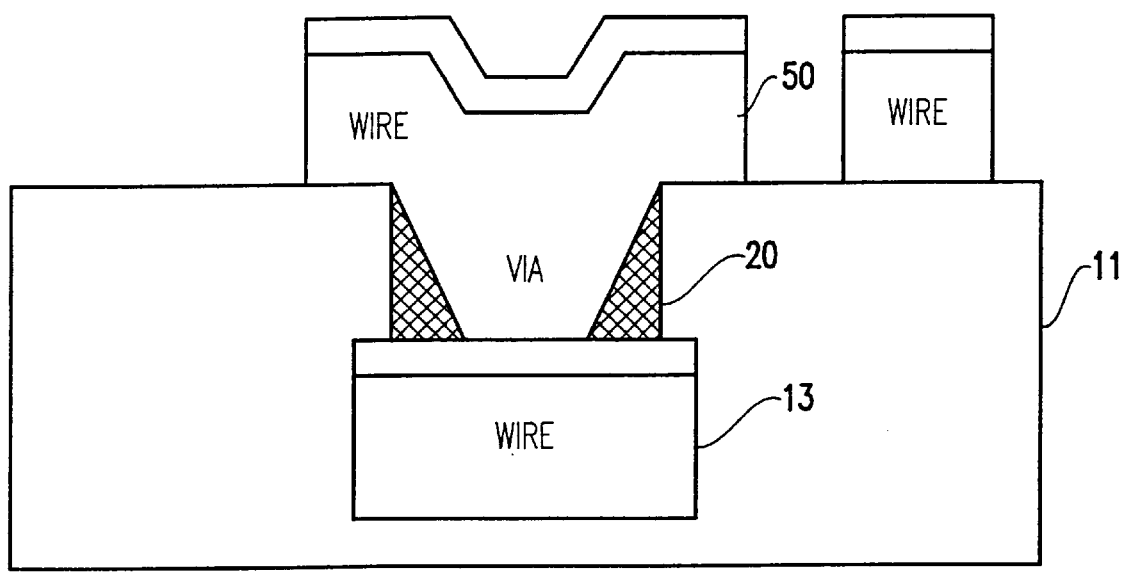
FIG. 5 is a schematic illustration of a completed via filled with an electrically conductive material according to the invention.

As shown in FIG. 5, the over-layer conductor 50 is then deposited, and patterned using conventional lithography and etch techniques (i.e., wire formation).

The over-layer wire 50 will make contact to the under-layer wire 13 through the tapered via contact. Low resistance, and high reliability of the contact is provided by the taper due to the complete filling of the over-layer material 50 in the contact 10.

In the prior art, the reflow material is etched from the horizontal surfaces after the reflow step and the reflow material coats the complete wafer surface. To the contrary, with the invention, the reflow material in not annealed until after it is etched from the horizontal surfaces. This allows more precise control of the reflow process.

The control of the reflow material is increased because of the smaller volume of the reflow material utilized. Since the reflow material is preferably removed from all horizontal surfaces before the reflow process, only a small amount of reflow material remains on the ILD. This allows significantly improved control over the reflow of the spacer material. In other words, since the thickness and overall volume of the reflow material is known to be within a narrow range (because so little is allowed to remain on the ILD), the effect of the temperature change (or the annealing process) will dependably cause a more precise adjustment of the taper shape of the reflow material than would be available with larger volumes of reflow material. Also, subsequent etching steps are cleaner because of the reduced amount of reflow material exposed.

Since the reflow material is removed from the field region (i.e., is removed from the bottom of the via), the dielectric constant in the field region may be kept low.

Further, with the invention, application to small feature sizes is obtained by reducing the deposition thickness of the reflow spacer material in proportion to the dimension of the contact opening. Conventional blanket reflow material taper via formation is limited by the dimensional stability of the bulk reflow material.

The reflow spacer may be integrated with global planarization such as chemical-mechanical polishing (CMP) because the CMP properties of the bulk ILD may be selected independently of the reflow material with the invention.

Having thus described our invention, what we claim as new and desire to secure by Letters Patent is as follows:

1. A method of forming a via having tapered sidewalls in a substrate, said method comprising steps of:

forming an opening in said substrate, said opening including sidewalls and a lower surface, said sidewalls having a first end adjacent said lower surface and a second end opposite said first end;

forming a layer of a reflow material over said sidewalls and said lower surface;

removing said reflow material from said lower surface; and causing said reflow material to change from a solid state to a non-solid state such that said reflow is tapered along said sidewalls and has a first thickness at said first end of said sidewalls and a second thickness at said second end of said sidewalls, wherein said first thickness is greater than said second thickness.

2. The method as in claim 1, wherein said step of forming an opening comprises a step of photo-lithographic etching.

3. The method as in claim 1, further comprising a first step of selecting said substrate to have predetermined dielectric properties and a second step of selecting said reflow material, said first selecting step being made independently of said second selecting step.

4. The method as in claim 1, wherein said step of removing said reflow material comprises a step of anisotropic dry etching.

5. The method as in claim 1, wherein said step of causing said reflow material to change from a solid state to a non-solid state comprises a step of annealing said reflow material.

6. The method as in claim 1, wherein said substrate includes at least one of a dielectric and a conductor that have a first phase transition temperature and said reflow material has a second phase transition temperature lower than said first phase transition temperature, said step of causing said reflow material to change from a solid state to a non-solid state comprising a step of heating said reflow material to a temperature between said first phase transition temperature and said second phase transition temperature.

7. A method of forming an opening having tapered walls in a first material, said method comprising steps of:

forming said opening having sidewalls and a lower surface in said first material;

forming a layer of a second material over said sidewalls and said lower surface, wherein said first material has a first phase transition temperature and said second material has a second phase transition temperature lower than said first phase transition temperature;

removing at least a portion of said second material from said lower surface; and heating said second material to a temperature between said first phase transition temperature and said second phase transition temperature, such that said second material is tapered along said sidewalls.

8. The method as in claim 7, wherein said sidewalls have a first end adjacent said lower surface and a second end opposite said first end and said heating step causes said second material to change from a solid state to a non-solid state such that said second material has a first thickness at said first end of said sidewalls and a second thickness at said second end of said sidewalls, wherein said first thickness is greater than said second thickness.

9. The method as in claim 7, wherein said step of forming said opening comprises a step of photo-lithographic etching.

10. The method as in claim 7, further comprising a first step of selecting said first material to have predetermined dielectric properties and a second step of selecting said second material, said first selecting step being made independently of said second selecting step.

11. The method as in claim 7, wherein said step of removing said second material comprises a step of anisotropic dry etching.

12. The method as in claim 7, wherein said second layer comprises a first conductive material and said method further comprises a step of depositing a second conductive material in said opening, such that said first conductive material comprises an underlayer of said second conductive material.

13. The method as in claim 12, wherein said first conductive material comprises aluminum and said second conductive material comprises tungsten.

\* \* \* \* \*